(12) United States Patent
Harada et al.

(10) Patent No.: US 11,056,337 B2
(45) Date of Patent: *Jul. 6, 2021

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Katsuyoshi Harada, Toyama (JP); Tatsuru Matsuoka, Toyama (JP); Yoshitomo Hashimoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/988,235

(22) Filed: Aug. 7, 2020

(65) Prior Publication Data

US 2020/0373151 A1 Nov. 26, 2020

Related U.S. Application Data

(63) Continuation of application No. 16/286,292, filed on Feb. 26, 2019, now Pat. No. 10,770,287.

(30) Foreign Application Priority Data

Feb. 28, 2018 (JP) .............................. JP2018-034770

(51) Int. Cl.
*H01L 21/02* (2006.01)
*C23C 16/455* (2006.01)
*C23C 16/34* (2006.01)

(52) U.S. Cl.
CPC ........ *H01L 21/0228* (2013.01); *C23C 16/345* (2013.01); *C23C 16/45553* (2013.01); *H01L 21/0217* (2013.01); *H01L 21/02211* (2013.01)

(58) Field of Classification Search
CPC ............ H01L 21/0228; H01L 21/0217; H01L 21/02211; H01L 21/02274;
(Continued)

(56) References Cited

U.S. PATENT DOCUMENTS 10,770,287 B2 * 9/2020 Harada ............. C23C 16/45578
2002/0024118 A1 2/2002 Okoshi et al.
(Continued)

FOREIGN PATENT DOCUMENTS

JP    2002-076308 A    3/2002
JP    2017-069230      4/2017
(Continued)

OTHER PUBLICATIONS

Korean Office Action dated Mar. 30, 2020 for the Korean Patent Application No. 10-2019-0021619.
(Continued)

*Primary Examiner* — Kyoung Lee
(74) *Attorney, Agent, or Firm* — Volpe Koenig

(57) ABSTRACT

There is provided a technique, including: (a) forming NH termination on a surface of a substrate by supplying a first reactant containing N and H to the substrate; (b) forming a first SiN layer having SiCl termination formed on its surface by supplying $SiCl_4$ as a precursor to the substrate to react the NH termination formed on the surface of the substrate with the $SiCl_4$; (c) forming a second SiN layer having NH termination formed on its surface by supplying a second reactant containing N and H to the substrate to react the SiCl termination formed on the surface of the first SiN layer with the second reactant; and (d) forming a SiN film on the substrate by performing a cycle a predetermined number of times under a condition where the $SiCl_4$ is not gas-phase decomposed after performing (a), the cycle including non-simultaneously performing (b) and (c).

20 Claims, 7 Drawing Sheets

(58) Field of Classification Search
CPC ............ C23C 16/45553; C23C 16/345; C23C 16/45546; C23C 16/45578; C23C 16/45525
See application file for complete search history.

(56) References Cited

U.S. PATENT DOCUMENTS

| | | | |
|---|---|---|---|
| 2003/0099845 A1* | 5/2003 | Ogawa | ................ H01L 51/0075 428/447 |
| 2004/0023456 A1 | 2/2004 | Lee et al. | |
| 2015/0376781 A1 | 12/2015 | Kogura et al. | |
| 2017/0053792 A1 | 2/2017 | Lu et al. | |
| 2017/0087606 A1 | 3/2017 | Nakamura et al. | |
| 2017/0218510 A1 | 8/2017 | Kato et al. | |
| 2017/0250072 A1 | 8/2017 | Takamura | |
| 2017/0372890 A1 | 12/2017 | Horiike et al. | |
| 2018/0308681 A1 | 10/2018 | Harada et al. | |

FOREIGN PATENT DOCUMENTS

| | | |
|---|---|---|
| JP | 2017-139306 A | 8/2017 |
| JP | 2017-228700 A | 12/2017 |
| KR | 20050015665 A | 2/2005 |
| KR | 20100109884 A | 10/2010 |
| WO | 2017/0053792 A1 | 3/2017 |

OTHER PUBLICATIONS

Singaporean Search Report and Written Opinion dated May 13, 2019 for the Singaporean Patent Application No. 10201901678W.

Taiwanese Office Action dated Dec. 20, 2019 for the Taiwanese Patent Application No. 108102263.

Japanese Office Action dated Jun. 23, 2020 for the Japanese Patent Application No. 2018-034770.

\* cited by examiner

First reactant (NH₃)

Precursor (SiCl₄)

Second reactant (NH₃)

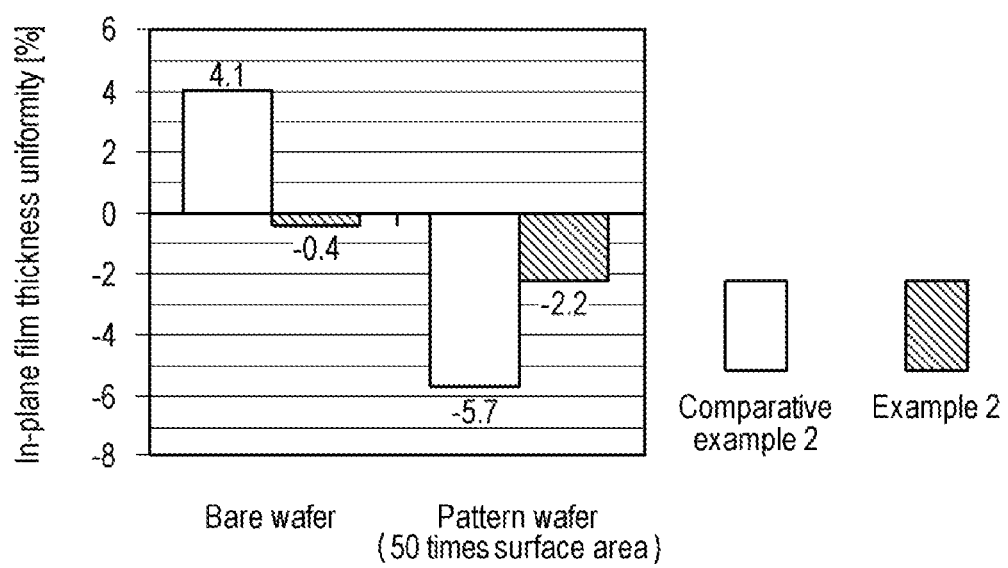

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This non-provisional U.S. patent application is a continuation of U.S. patent application Ser. No. 16/286,292, filed on Feb. 26, 2019 and claims the benefit of priority from Japanese Patent Application No. 2018-034770, filed on Feb. 28, 2018, the entire contents of which are incorporated herein by reference.

TECHNICAL FIELD

The present disclosure relates to a method of manufacturing a semiconductor device, a substrate processing apparatus, and a recording medium.

BACKGROUND

In a related art, as an example of a process of manufacturing a semiconductor device, a process of forming a film containing silicon (Si) and nitrogen (N), i.e., a silicon nitride film (SiN film), on a substrate is carried out.

SUMMARY

The present disclosure provides some embodiments of a technique that improves film thickness uniformity of a SiN film formed on a substrate in a plane of the substrate.

According to an embodiment of the present disclosure, there is provided a technique, which includes: (a) forming NH termination on a surface of a substrate by supplying a first reactant containing N and H to the substrate; (b) forming a first SiN layer having SiCl termination formed on its surface by supplying $SiCl_4$ as a precursor to the substrate to react the NH termination formed on the surface of the substrate with the $SiCl_4$; (c) forming a second SiN layer having NH termination formed on its surface by supplying a second reactant containing N and H to the substrate to react the SiCl termination formed on the surface of the first SiN layer with the second reactant; and (d) forming a SiN film on the substrate by performing a cycle a predetermined number of times under a condition where the $SiCl_4$ is not gas-phase decomposed after performing (a), the cycle including non-simultaneously performing (b) and (c).

BRIEF DESCRIPTION OF DRAWINGS

FIG. 7 is a diagram illustrating an evaluation result of film thickness uniformity of a SiN film formed on a substrate in the plane of the substrate.

DETAILED DESCRIPTION

One Embodiment of the Present Disclosure

An embodiment of the present disclosure will now be described in detail mainly with reference to FIGS. 1 to 5C.

(1) Configuration of the Substrate Processing Apparatus

Figure 1:
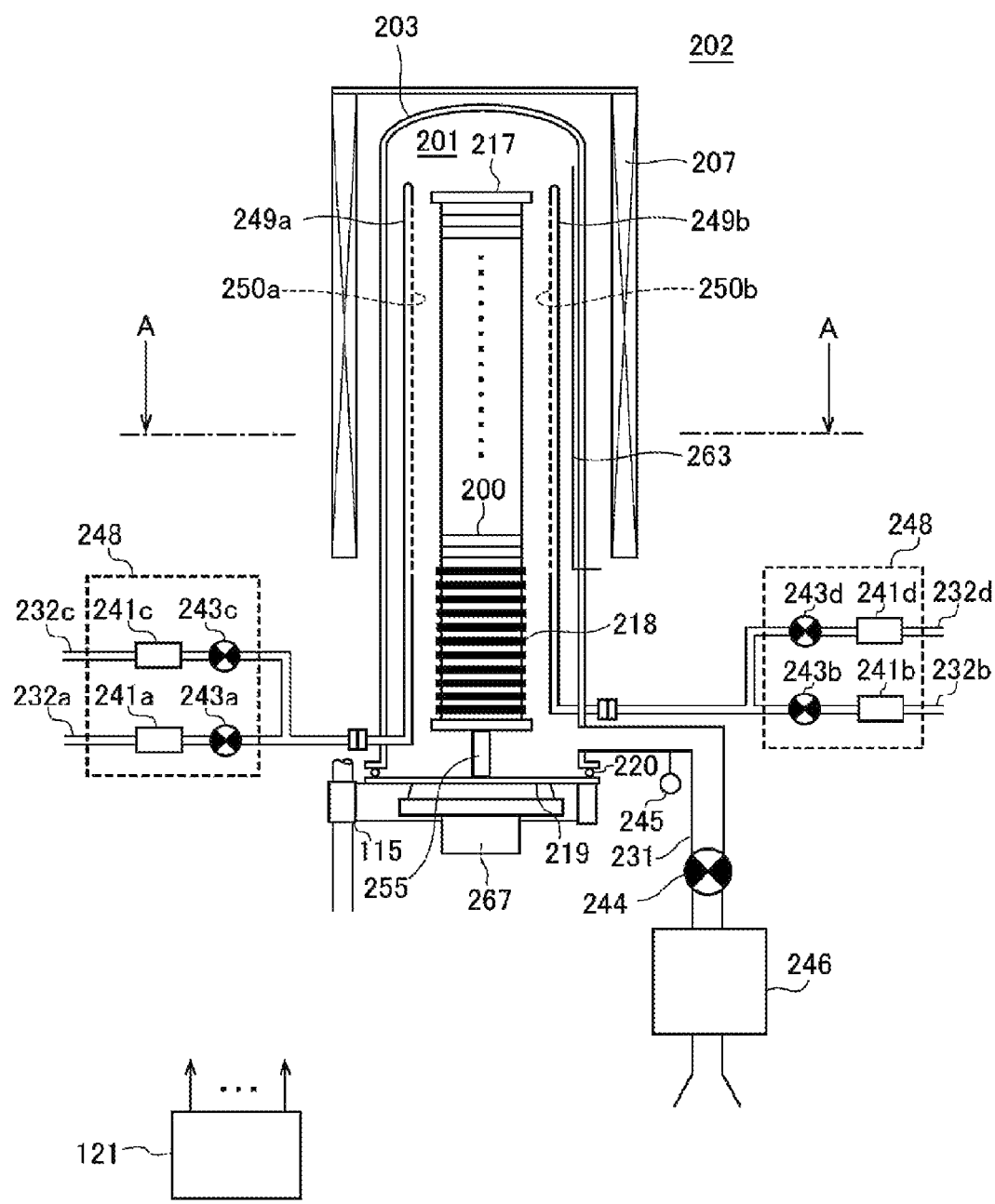
FIG. 1 is a schematic configuration diagram of a vertical type process furnace of a substrate processing apparatus suitably used in an embodiment of the present disclosure, in which a portion of the process furnace is shown in a vertical cross sectional view.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC) or the like, and has a cylindrical shape with its upper end closed and its lower end opened. A process chamber 201 is formed in a hollow cylindrical portion of the reaction tube 203. The process chamber 201 is configured to accommodate wafers 200 as substrates. The processing of the wafers 200 is performed in the process chamber 201.

Nozzles 249a and 249b are installed in the process chamber 201 so as to penetrate a lower sidewall of the reaction tube 203. Gas supply pipes 232a and 232b are respectively connected to the nozzles 249a and 249b.

Mass flow controllers (MFCs) 241a and 241b, which are flow rate controllers (flow rate control parts), and valves 243a and 243b, which are opening/closing valves, are installed in the gas supply pipes 232a and 232b sequentially from the corresponding upstream sides of gas flow, respectively. Gas supply pipes 232c and 232d are respectively connected to the gas supply pipes 232a and 232b at the downstream side of the valves 243a and 243b. MFCs 241c and 241d and valves 243c and 243d are respectively installed in the gas supply pipes 232c and 232d sequentially from the corresponding upstream sides of gas flow.

Figure 2:
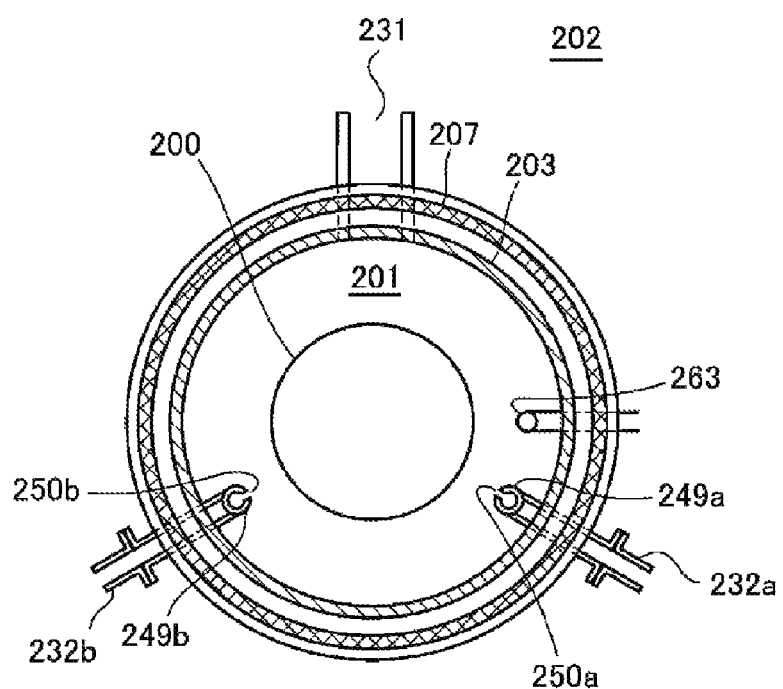
FIG. 2 is a schematic configuration diagram of a vertical type process furnace of the substrate processing apparatus suitably used in an embodiment of the present disclosure, in which a portion of the process furnace is shown in a cross sectional view taken along line A-A in FIG. 1.

As illustrated in FIG. 2, the nozzles 249a and 249b are disposed in a space with an annular plan-view shape between the inner wall of the reaction tube 203 and the wafers 200 such that the nozzles 249a and 249b extend upward along an arrangement direction of the wafers 200 from a lower portion of the inner wall of the reaction tube 203 to an upper portion of the inner wall of the reaction tube 203. Specifically, the nozzles 249a and 249b are installed at a lateral side of a wafer arrangement region in which the wafers 200 are arranged, namely in a region which horizontally surrounds the wafer arrangement region, so as to extend along the wafer arrangement region. Gas supply holes 250a and 250b for supplying a gas are installed on the side surfaces of the nozzles 249a and 249b, respectively. The gas supply holes 250a and 250b are opened toward the center of the reaction tube 203 so as to allow a gas to be supplied toward the wafers 200. The gas supply holes 250a and 250b may be formed in a plural number between the lower portion of the reaction tube 203 and the upper portion of the reaction tube 203.

A precursor (precursor gas), for example, a chlorosilane-based gas which contains silicon (Si) and chlorine (Cl), is supplied from the gas supply pipe 232a into the process chamber 201 via the MFC 241a, the valve 243a, and the nozzle 249a. The precursor gas refers to a gaseous precursor, for example, a gas obtained by vaporizing a precursor which remains in a liquid state under a room temperature and an atmospheric pressure, or a precursor which remains in a gas state under a room temperature and an atmospheric pressure. As the chlorosilane-based gas, it may be possible to use, for example, a tetrachlorosilane ($SiCl_4$) gas. The $SiCl_4$ gas contains four chemical bonds (Si—Cl bonds) of Si and Cl in one molecule.

A hydrogen nitride-based gas containing, for example, nitrogen (N) and hydrogen (H), as first and second reactants, is supplied from the gas supply pipe 232b into the process chamber 201 via the MFC 241b, the valve 243b, and the nozzle 249b. As the hydrogen nitride-based gas, it may be possible to use, for example, an ammonia ($NH_3$) gas. The $NH_3$ gas contains three chemical bonds (N—H bonds) of N and H in one molecule.

A nitrogen ($N_2$) gas as an inert gas is supplied from the gas supply pipes 232c and 232d into the process chamber 201 via the MFCs 241c and 241d, the valves 243c and 243d, the gas supply pipes 232a and 232b, and the nozzles 249a and 249b. The $N_2$ gas acts as a purge gas, a carrier gas, a dilution gas, or the like.

A precursor supply system includes the gas supply pipe 232a, the MFC 241a, and the valve 243a. A reactant supply system (first and second reactant supply systems) includes the gas supply pipe 232b, the MFC 241b, and the valve 243b. An inert gas supply system includes the gas supply pipes 232c and 232d, the MFCs 241c and 241d, and the valves 243c and 243d.

One or all of various supply systems described above may be configured as an integrated supply system 248 in which the valves 243a to 243d, the MFCs 241a to 241d, and the like are integrated. The integrated supply system 248 is connected to each of the gas supply pipes 232a to 232d so that a supply operation of various kinds of gases into the gas supply pipes 232a to 232d, i.e., an opening/closing operation of the valves 243a to 243d, a flow rate adjusting operation by the MFCs 241a to 241d or the like, is controlled by a controller 121 which will be described later. The integrated supply system 248 is configured as an integral type or division type integrated unit, and is also configured so that it is detachable from the gas supply pipes 232a to 232d or the like, so as to perform maintenance, replacement, expansion or the like of the integrated supply system 248, on an integrated unit basis.

An exhaust pipe 231 configured to exhaust an internal atmosphere of the process chamber 201 is installed at a lower side of the sidewall of the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust of the interior of the process chamber 201 and a vacuum exhaust stop can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system includes the exhaust pipe 231, the pressure sensor 245 and the APC valve 244. The vacuum pump 246 may be regarded as being included in the exhaust system.

A seal cap 219, which serves as a furnace opening cover configured to hermetically seal a lower end opening of the reaction tube 203, is installed under the reaction tube 203. The seal cap 219 is made of a metal material such as, e.g., stainless steel (SUS) or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 215 is configured as a transfer device (transfer mechanism) which loads and unloads (transfers) the wafers 210 into and from (out of) the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
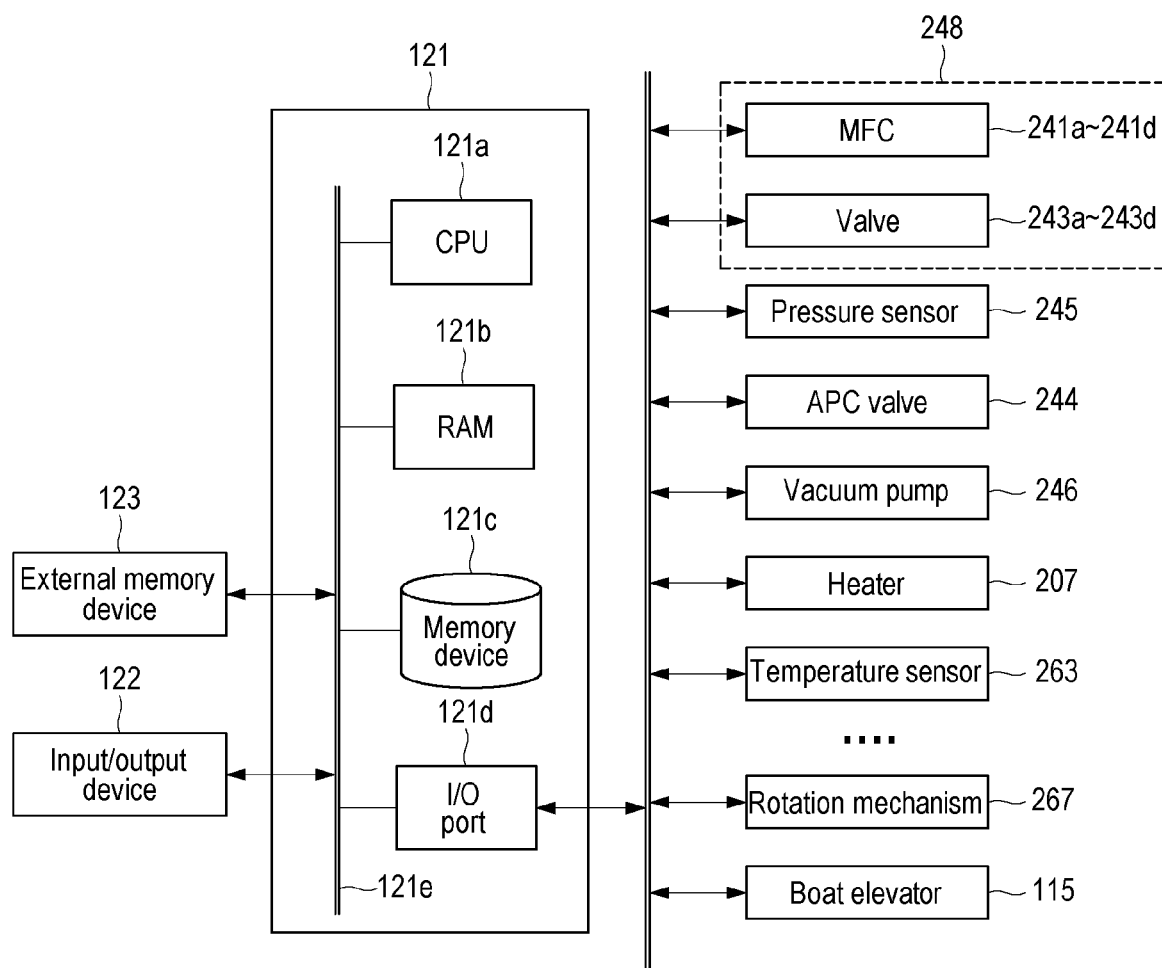
FIG. 3 is a schematic configuration diagram of a controller of the substrate processing apparatus suitably used in one embodiment of the present disclosure, in which a control system of a controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of a film-forming process as described hereinbelow, or the like is readably stored in the memory device 121c. The process recipe functions as a program for causing the controller 121 to execute each sequence in the film-forming process, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data and the like read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing

A substrate processing sequence example of forming a SiN film on a wafer 200 as a substrate using the aforementioned substrate processing apparatus, i.e., a film-forming sequence example, which is one of the processes for manufacturing a semiconductor device, will be described with reference to FIG. 4. In the following descriptions, the operations of the respective parts constituting the substrate processing apparatus are controlled by the controller 121.

Figure 4:
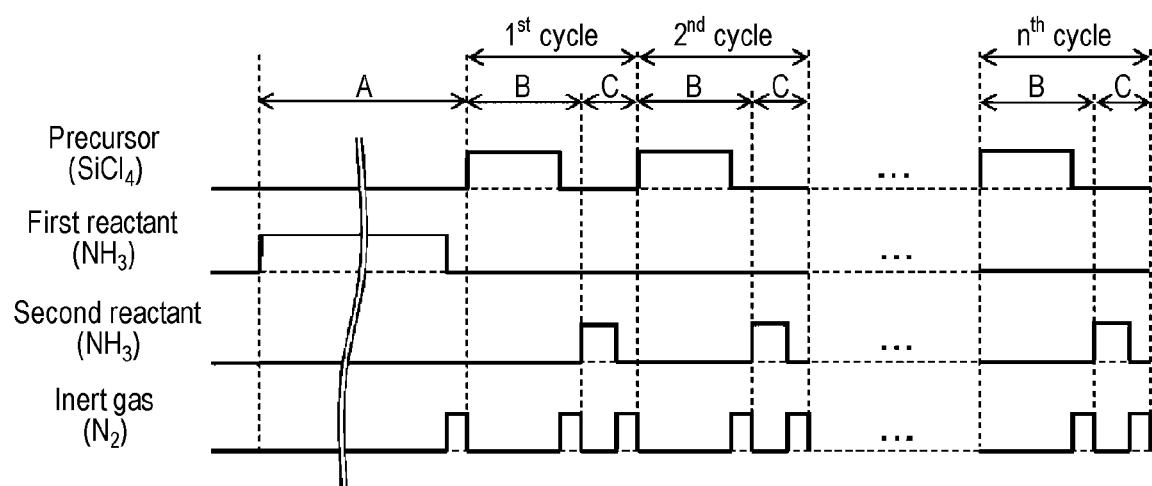
FIG. 4 is a diagram illustrating a film-forming sequence according to an embodiment of the present disclosure.

In the film-forming sequence illustrated in FIG. 4, there are performed: step A of supplying an $NH_3$ gas as a first reactant containing N and H to a wafer 200 to form NH termination on a surface of the wafer 200; step B of supplying a $SiCl_4$ gas as a precursor to the wafer 200 to react the NH termination formed on the surface of the wafer 200 with $SiCl_4$ to form a first SiN layer having SiCl termination formed on its surface; and step C of supplying an $NH_3$ gas as a second reactant containing N and H to the wafer 200 to react the SiCl termination formed on the surface of the first SiN layer with the $NH_3$ gas to form a second SiN layer having NH termination formed on its surface.

Specifically, a cycle which non-simultaneously performs step B and step C described above under a condition in which $SiCl_4$ is not gas-phase decomposed after performing step A described above is implemented a predetermined number of times. Thus, a SiN film is formed on the wafer 200. Furthermore, in FIG. 4, execution periods of steps A, B, and C are denoted as A, B, and C, respectively.

In the present disclosure, for the sake of convenience, the film-forming sequence illustrated in FIG. 4 may sometimes be denoted as follows. The same denotation will be used in other embodiments and the like as described hereinbelow.

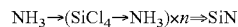

$NH_3 \to (SiCl_4 \to NH_3) \times n \Rightarrow SiN$

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

Wafer Charging and Boat Loading

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220.

Pressure Regulation and Temperature Adjustment

The interior of the process chamber 201, namely the space in which the wafers 200 are located, is vacuum-exhausted (depressurization-exhausted) by the vacuum pump 246 so as to reach a desired processing pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired processing temperature (film-forming temperature). In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The driving of the vacuum pump 246 and the heating and rotation of the wafers 200 may be all continuously performed at least until the processing of the wafers 200 is completed.

Film-Forming Process

Next, the following steps A and B are sequentially performed.

[Step A]

At this step, an $NH_3$ gas is supplied to the wafer 200 in the process chamber 201. Specifically, the valve 243b is opened to allow an $NH_3$ gas to flow through the gas supply pipe 232b. The flow rate of the $NH_3$ gas is adjusted by the MFC 241b. The $NH_3$ gas is supplied into the process chamber 201 via the nozzle 249b and is exhausted from the exhaust pipe 231. At this time, the $NH_3$ gas is supplied to the wafer 200 from the side of the wafer 200. Simultaneously, the valves 243c and 243d may be opened to allow an $N_2$ gas to flow through the gas supply pipes 232c and 232d.

The processing conditions at this step may be exemplified as follows:

$NH_3$ gas supply flow rate: 100 to 10,000 sccm
$N_2$ gas supply flow rate (per gas supply pipe): 0 to 10,000 sccm
Supply time of each gas: 1 to 30 minutes
Processing temperature: 300 to 1,000 degrees C., 700 to 900 degrees C. in some embodiments, or 750 to 800 degrees C. in some embodiments
Processing pressure: 1 to 4,000 Pa or 20 to 1,333 Pa in some embodiments.

Furthermore, in the present disclosure, the expression of the numerical range such as "300 to 1,000 degrees C." may mean that a lower limit value and an upper limit value are included in that range. Therefore, "300 to 1,000 degrees C." may mean "300 degrees C. or higher and 1,000 degrees C. or lower". The same applies to other numerical ranges.

Figure 5A:
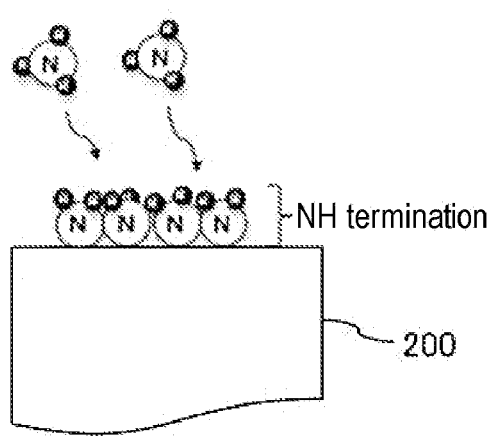
FIG. 5A illustrates a partial enlarged view of a surface of a substrate after a first reactant is supplied.

A natural oxide film or the like may be formed on the surface of the wafer 200 prior to performing a film-forming process. By supplying the $NH_3$ gas to the wafer 200 under the aforementioned conditions, NH termination can be formed on the surface of the wafer 200 on which the natural oxide film or the like is formed. Thus, a desired film-forming reaction can go ahead on the wafer 200 at step B as described hereinbelow. A partial enlarged view of the surface of the wafer 200 on which the NH termination is formed is illustrated in FIG. 5A. The NH termination formed on the surface of the wafer 200 may be regarded as synonymous with an H termination. Furthermore, since the supply of the $NH_3$ gas to the wafer 200 and the process of forming the NH termination on the surface of the wafer 200 at this step are performed prior to a substantial film-forming process (steps B and C), they will be referred to as pre-flow and pre-processing, respectively.

In the case where the $NH_3$ gas is supplied to the wafer 200 from the side of the wafer 200 as in the present embodiment, there is a tendency that the formation of the NH termination starts earlier in an outer peripheral portion of the wafer 200, and starts in the central portion of the wafer 200 with delay. This phenomenon becomes particularly conspicuous when a pattern including a recess such as a trench or a hole is formed on the surface of the wafer 200. At this step, if the supply time of the $NH_3$ gas is less than 1 minute, although the NH termination may be formed in the outer peripheral portion of the wafer 200, the NH termination may be difficult to be formed in the center portion of the wafer 200. By setting the supply time of the $NH_3$ gas at a time of 1 minute or more, it is possible to form the NH termination from the outer peripheral portion to the central portion of the wafer 200 uniformly, i.e., substantially uniformly in amount and density. However, if the supply time of the $NH_3$ gas exceeds 30 minutes, the supply of the $NH_3$ gas to the wafer 200 may be continued in a state in which the formation reaction of the NH termination on the surface of the wafer 200 is saturated. As a result, usage amount of the $NH_3$ gas which does not contribute to the formation of the NH termination unnecessarily increases, which may increase a gas cost. By setting the supply time of the $NH_3$ gas at a time of 30 minutes or less, it is possible to suppress an increase in the gas cost.

After the NH termination is formed on the surface of the wafer 200 by pre-flowing the $NH_3$ gas to the wafer 200, the valve 243b is closed to stop the supply of the $NH_3$ gas into the process chamber 201. Then, the interior of the process chamber 201 is vacuum-exhausted and the gas or the like remaining within the process chamber 201 is removed from the interior of the process chamber 201. At this time, the valves 243c and 243d are opened to supply an $N_2$ gas as a purge gas into the process chamber 201 (purge step). The processing pressure at the purge step may be set at a pressure of, for example, 1 to 100 Pa, and the supply flow rate of the $N_2$ gas may be set at a flow rate of, for example, 10 to 10,000 sccm.

As the first reaction gas, it may be possible to use, in addition to the $NH_3$ gas, a hydrogen nitride-based gas such as a diazene ($N_2H_2$) gas, a hydrazine ($N_2H_4$) gas, and an $N_3H_8$ gas.

As the inert gas, it may be possible to use, in addition to the $N_2$ gas, a rare gas such as an Ar gas, an He gas, an Ne gas, and an Xe gas. This also applies to steps B and C as described hereinbelow.

[Step B]

At this step, a $SiCl_4$ gas is supplied to the wafer 200 in the process chamber 201, namely the NH termination formed on the surface of the wafer 200. Specifically, the opening/closing control of the valves 243a, 243c and 243d is performed in the same procedure as the opening/closing control of the valves 243b to 243d at step A. The flow rate of the $SiCl_4$ gas is controlled by the MFC 241a. The $SiCl_4$ gas is supplied into the process chamber 201 via the nozzle 249a and is exhausted from the exhaust pipe 231. At this time, the $SiCl_4$ gas is supplied to the wafer 200 from the side of the wafer 200.

The processing conditions at this step may be exemplified as follows:

$SiCl_4$ gas supply flow rate: 10 to 2,000 sccm, or 100 to 1,000 sccm in some embodiments
Supply time of $SiCl_4$ gas: 60 to 180 seconds, or 60 to 120 seconds in some embodiments
Processing temperature: 300 to 1,000 degrees C., 700 to 900 degrees C. in some embodiments, or 750 to 800 degrees C. in some embodiments
Processing pressure: 1 to 2,000 Pa, or 20 to 1,333 Pa in some embodiments.

Other processing conditions may be similar to the processing conditions of step A.

By supplying the $SiCl_4$ gas to the wafer 200 under the aforementioned conditions, it is possible to react the NH termination formed on the surface of the wafer 200 with $SiCl_4$. Specifically, at least a portion of Si—Cl bonds in $SiCl_4$ and at least a portion of N—H bonds in the NH termination formed on the surface of the wafer 200 can be broken. Furthermore, Si after the at least a portion of Si—Cl bonds in $SiCl_4$ are broken can be bonded to N after the at least a portion of N—H bonds in the NH termination formed on the surface of the wafer 200 are broken to form Si—N bonds. Cl separated from Si and H separated from N respectively constitute gaseous substances such as HCl or the like so as to be desorbed from the wafer 200 and are exhausted from the exhaust pipe 231.

In addition, at this step, the Si—Cl bonds, which are not converted into the Si—N bonds among the Si—Cl bonds in SiCl$_4$ during the aforementioned reaction, can be held without being broken. That is, at this step, Si after the at least a portion of Si—Cl bonds in SiCl$_4$ are broken can be bonded to N after the at least a portion of N—H bonds in the NH termination formed on the surface of the wafer 200 are broken in a state where Cl is bonded to each of three bonding hands of four bonding hands of Si constituting SiCl$_4$.

Figure 5B:
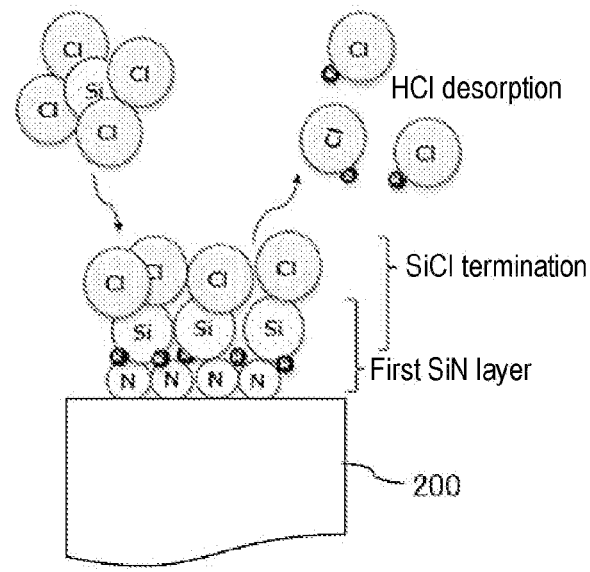
FIG. 5B illustrates a partial enlarged view of a surface of a substrate after a precursor is supplied.

In the present disclosure, the aforementioned reaction proceeding on the surface of the wafer 200 at step B will be referred to as an adsorptive substitution reaction. At this step, the adsorptive substitution reaction described above can go ahead to form a layer which contains Si and N and whose entire surface is terminated with SiCl, i.e., a silicon nitride layer (first SiN layer) having SiCl termination formed on its surface, on the wafer 200. A partial enlarged view of the surface of the wafer 200 on which the first SiN layer having SiCl termination formed on its surface is formed is illustrated in FIG. 5B. Furthermore, in FIG. 5B, illustration of part of Cl is omitted for the sake of convenience. The first SiN layer having SiCl termination formed on its surface becomes a layer in which further Si deposition on the wafer 200 does not go ahead even if the supply of the SiCl$_4$ gas to the wafer 200 is further continued after the formation of this layer, due to Cl constituting the SiCl termination acting as steric hindrance. That is, the first SiN layer having SiCl termination formed on its surface becomes a layer to which self-limitation is applied for further Si adsorption reaction. Accordingly, the thickness of the first SiN layer becomes a uniform thickness of less than one atomic layer (less than one molecular layer) over the entire region in the plane of the wafer. Furthermore, the SiCl termination formed on the surface of the wafer 200 may be regarded as synonymous with a Cl termination.

The processing conditions at this step are conditions under which SiCl$_4$ supplied into the process chamber 201 is not gas-phase decomposed (pyrolyzed). That is, the aforementioned processing conditions are conditions under which SiCl$_4$ supplied into the process chamber 201 does not generate an intermediate in the gas phase and the Si deposition on the wafer 200 by the gas-phase reaction does not go ahead. In other words, the processing conditions described above are conditions under which only the adsorptive substitution reaction described above can occur on the wafer 200. By setting the processing conditions at this step to such conditions, it is possible to allow the first SiN layer formed on the wafer 200 to become a layer having excellent thickness uniformity in the plane of the wafer (hereinafter, also simply referred to as in-plane thickness uniformity).

If the film-forming temperature (processing temperature) is lower than 300 degrees C., there may be a case where it is difficult for the first SiN layer to be formed on the wafer 200 and for the formation of the SiN film on the wafer 200 to go ahead at a practical deposition rate. Furthermore, a large amount of impurity such as Cl or the like may remain in the SiN film formed on the wafer 200, lowering a processing resistance of the SiN film. By setting the film-forming temperature at a temperature of 300 degree C. or higher, the formation of the SiN film on the wafer 200 can go ahead at a practical deposition rate. In addition, it is possible to allow the SiN film formed on the wafer 200 to become a film having low impurity concentration and excellent processing resistance. By setting the film-forming temperature at a temperature of 700 degrees C. or higher, it is possible to reliably achieve the aforementioned effects. By setting the film-forming temperature at a temperature of 750 degrees C. or higher, it is possible to more reliably achieve the aforementioned effects.

If film-forming temperature exceeds 1,000 degrees C., there may be a case where a reaction other than the aforementioned adsorptive substitution reaction goes ahead in the process chamber 201. For example, the Si—Cl bonds which are not converted into the Si—N bonds among the Si—Cl bonds in SiCl$_4$ may be broken, making it difficult to be SiCl-terminated on the entire surface of the first SiN layer. That is, it may be difficult for the first SiN layer to become a layer to which self-limitation is applied for further Si adsorption reaction. In addition, SiCl$_4$ supplied into the process chamber 201 is gas-phase decomposed (pyrolyzed) to generate an intermediate, and the Si deposition on the wafer 200 by the gas-phase reaction may go ahead. As a result, the in-plane thickness uniformity of the first SiN layer formed on the wafer 200, i.e., the film thickness uniformity of the SiN film in the plane of the substrate (hereinafter, simply referred to as in-plane film thickness uniformity), may be deteriorated. By setting the film-forming temperature at a temperature of 1,000 degrees C. or lower, it is possible to solve the problems described above. By setting the film-forming temperature at a temperature of 900 degrees C. or lower, it is possible to reliably solve the problems described above. By setting the film-forming temperature at a temperature of 800 degrees C. or lower, it is possible to more reliably solve the problems described above.

From these facts, it is desirable that the film-forming temperature be set at 300 to 1,000 degrees C., 700 to 900 degrees C. in some embodiments, or 750 to 800 degrees C. in some embodiments. Furthermore, among the temperature conditions illustrated above, the relatively high temperature condition such as, e.g., 700 to 900 degrees C., is a temperature condition under which a chlorosilane-based gas such as a dichlorosilane (SiH$_2$Cl$_2$, abbreviation: DCS) gas, a hexachlorodisilane (Si$_2$Cl$_6$, abbreviation: HCDS) gas or the like is gas-phase decomposed. On the other hand, the SiCl$_4$ gas is not gas-phase decomposed even under a high temperature condition in which the DCS gas or the HCDS gas is gas-phase decomposed. Therefore, when performing the film-forming process at this relatively high temperature zone, it can be said that the SiCl$_4$ gas is a precursor capable of enhancing the thickness controllability of the SiN film formed on the wafer 200.

In the case where the SiCl$_4$ gas is supplied to the wafer 200 from the side of the wafer 200 as in the present embodiment, there is a tendency that the formation of the first SiN layer starts earlier in the outer peripheral portion of the wafer 200, and starts in the central portion of the wafer 200 with delay. This phenomenon becomes particularly conspicuous when the aforementioned pattern is formed on the surface of the wafer 200. At this step, if the supply time of the SiCl$_4$ gas is less than 60 seconds, although the first SiN layer may be formed in the outer peripheral portion of the wafer 200, the first SiN layer may be difficult to be formed in the central portion of the wafer 200. By setting the supply time of the SiCl$_4$ gas at a time of 60 seconds or more, it is possible to form the first SiN layer substantially uniformly, i.e., substantially uniformly in thickness and composition, from the outer peripheral portion to the central portion of the wafer 200. However, if the supply time of the SiCl$_4$ gas exceeds 180 seconds, the supply of the SiCl$_4$ gas to the wafer 200 may be continued in a state in which the formation reaction of the first SiN layer on the surface of the wafer 200 is saturated. As a result, the usage amount of the $SiCl_4$ gas which does not contribute to the formation of the first SiN layer unnecessarily increases, which may increase the gas cost. By setting the supply time of the $SiCl_4$ gas at a time of 180 seconds or less, it is possible to suppress an increase in gas cost. By setting the supply time of the $SiCl_4$ gas at a time of 120 seconds or less, it is possible to reliably suppress an increase in gas cost.

After the first SiN layer is formed on the wafer 200, the valve 243a is closed to stop the supply of the $SiCl_4$ gas into the process chamber 201. Then, the gas or the like remaining within the process chamber 201 is removed from the interior of the process chamber 201 under the same processing procedures and processing conditions as those of the purge step of step A described above.

[Step C]

At this step, an $NH_3$ gas is supplied to the wafer 200 in the process chamber 201, i.e., the first SiN layer formed on the wafer 200. Specifically, the opening/closing control of the valves 243b to 243d is performed in the same procedure as the opening/closing control of the valves 243b to 243d at step A. The flow rate of the $NH_3$ gas is controlled by the MFC 241b. The $NH_3$ gas is supplied into the process chamber 201 via the nozzle 249b and is exhausted from the exhaust pipe 231. At this time, the $NH_3$ gas is supplied to the wafer 200 from the side of the wafer 200.

The processing conditions at this step may be exemplified as follows:

Supply time of $NH_3$ gas: 1 to 60 seconds, or 1 to 50 seconds in some embodiments.

Other processing conditions may be similar to the processing conditions of step A.

By supplying the $NH_3$ gas to the wafer 200 under the aforementioned conditions, it is possible to react the SiCl termination formed on the surface of the first SiN layer with $NH_3$. Specifically, at least a portion of N—H bonds in $NH_3$ and at least a portion of Si—Cl bonds in the SiCl termination formed on the surface of the first SiN layer can be broken. Then, N after the at least a portion of N—H bonds in $NH_3$ are broken can be bonded to Si after the at least a portion of Si—Cl bonds in the SiCl termination formed on the surface of the first SiN layer are broken to form Si—N bonds. H separated from N and Cl separated from Si respectively constitute gaseous substances such as HCl or the like so as to be desorbed from the wafer 200 and are exhausted from the exhaust pipe 231.

At this step, the N—H bonds, which are not converted into the Si—N bonds among the N—H bonds in $NH_3$ during the aforementioned reaction, can be held without being broken. That is, at this step, N after the at least a portion of N—H bonds in $NH_3$ are broken can be bonded to Si after the at least a portion of Si—Cl bonds in the SiCl termination formed on the surface of the first SiN layer are broken in a state in which H is bonded to each of two bonding hands among three bonding hands of N constituting $NH_3$.

Figure 5C:
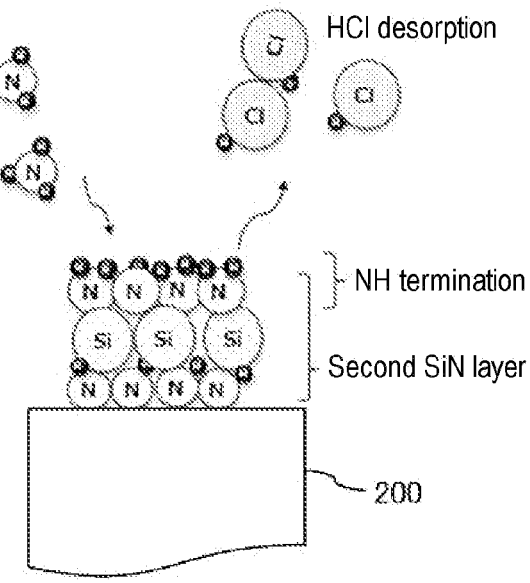
FIG. 5C illustrates a partial enlarged view of a surface of a substrate after a second reactant is supplied.

In the present disclosure, the aforementioned reaction proceeding on the surface of the wafer 200 at step C will be referred to as an adsorptive substitution reaction. At this step, the adsorptive substitution reaction described above can go ahead to form a layer which contains Si and N and whose entire surface is terminated with NH, i.e., a silicon nitride layer (second SiN layer) having NH termination formed on its surface, on the wafer 200. A partial enlarged view of the surface of the wafer 200 on which the second SiN layer having NH termination formed on its surface is formed is illustrated in FIG. 5C. Furthermore, the NH termination formed on the surface of the second SiN layer may be regarded as synonymous with the H termination.

The processing conditions at this step are conditions under which only the adsorptive substitution reaction described above occurs on the wafer 200. At this step, N after the at least a portion of N—H bonds in $NH_3$ are broken can be bonded to Si after the at least a portion of Si—Cl bonds in the SiCl termination formed on the surface of the wafer 200 are broken in a state where H is bonded to each of two bonding hands among three bonding hands of N constituting $NH_3$.

In the case where the $NH_3$ gas is supplied to the wafer 200 from the side of the wafer 200 as in the present embodiment, there is a tendency that the formation of the second SiN layer starts earlier in the outer peripheral portion of the wafer 200, and starts in the central portion of the wafer 200 with delay. This phenomenon becomes particularly conspicuous when the aforementioned pattern is formed on the surface of the wafer 200. At this step, if the supply time of the $NH_3$ gas is less than 1 second, although the second SiN layer may be formed in the outer peripheral portion of the wafer 200, the second SiN layer may be difficult to be formed in the central portion of the wafer 200. By setting the supply time of the $NH_3$ gas at a time of 1 second or more, it is possible to form the second SiN layer substantially uniformly, i.e., substantially uniformly in thickness and composition, from the outer peripheral portion to the central portion of the wafer 200. However, when the supply time of the $NH_3$ gas exceeds 60 seconds, the supply of the $NH_3$ gas to the wafer 200 may be continued in a state in which the formation reaction of the second SiN layer on the surface of the wafer 200 is saturated. As a result, the usage amount of the $NH_3$ gas which does not contribute to the formation of the second SiN layer unnecessarily increases, which may increase the gas cost. By setting the supply time of the $NH_3$ gas at a time of 60 seconds or less, it is possible to suppress an increase in gas cost. By setting the supply time of the $NH_3$ gas at a time of 50 seconds or less, it is possible to reliably suppress an increase in gas cost.

After the second SiN layer is formed on the wafer 200, the valve 243b is closed to stop the supply of the $NH_3$ gas into the process chamber 201. Then, the gas or the like remaining within the process chamber 201 is removed from the interior of the process chamber 201 under the same processing procedures and processing conditions of the purge step of step A described above.

As the second reaction gas, it may be possible to use, in addition to the $NH_3$ gas, various kinds of hydrogen nitride-based gases exemplified at step A described above. Furthermore, it may be possible to use different gases as the first reaction gas and the second reaction gas. For example, it may be possible to use the $NH_3$ gas as the first reaction gas and the $N_2H_2$ gas as the second reaction gas.

[Performing a Predetermined Number of Times]

After step A is performed, a cycle which non-simultaneously, i.e., non-synchronously, performs steps B and C is implemented a predetermined number of times (n times, where n is an integer of 1 or more), whereby a SiN film having a predetermined thickness can be formed on the wafer 200. The surface of the second SiN layer formed by performing step C becomes a surface terminated with NH, like the surface of the wafer 200 after performing step A. That is, the surface of the wafer 200 after performing step C becomes a surface on which the first SiN layer is easy to be formed when performing step B thereafter. Therefore, the cycle which non-simultaneously performs steps B and C after performing step A can be implemented a predetermined number of times to alternately perform the formation of the first SiN layer on the wafer 200 and the formation of the second SiN film on the wafer 200. As a result, the formation of the SiN film on the wafer 200 can go ahead with enhanced controllability. Furthermore, the aforementioned cycle may be repeated multiple times. That is, the thickness of the second SiN layer formed when the cycle which non-simultaneously performs steps B and C is implemented once may be set smaller than a desired thickness, and the aforementioned cycle may be repeated multiple times until the thickness of the SiN film formed by laminating the second SiN layer becomes equal to the desired thickness.

Furthermore, in order to allow the SiN film formed on the wafer 200 to become a film having excellent in-plane film thickness uniformity, it is desirable that the supply time of the $SiCl_4$ gas at step B may be set such that the thickness of the first SiN layer formed in the central portion of the wafer 200 becomes substantially equal to the thickness of the first SiN layer formed in the outer peripheral portion of the wafer 200 in some embodiments. In other words, the supply time of the $SiCl_4$ gas at step B may be set for a time so that the amount of the adsorptive substitution reaction occurring between the NH termination formed on the surface of the wafer 200 and the $SiCl_4$ gas in the central portion of the wafer 200 becomes substantially equal to the amount of the adsorptive substitution reaction occurring between the NH termination formed on the surface of the wafer 200 and the $SiCl_4$ gas in the outer peripheral portion of the wafer 200 in some embodiments. For example, by setting the supply time of the $SiCl_4$ gas at step B longer than the supply time of the $NH_3$ gas at step C, it is possible to reliably achieve the operational effects described above.

Furthermore, in order to allow the SiN film formed on the wafer 200 to become a film having excellent in-plane film thickness uniformity, the supply time of the $NH_3$ gas at step A may be set for a time so that the amount or density of the NH termination formed in the central portion of the wafer 200 becomes substantially equal to the amount or density of the NH termination formed in the outer peripheral portion of the wafer 200 in some embodiments. For example, by setting the supply time of the $NH_3$ gas at step A longer than the supply time of the $NH_3$ gas at step C, it is possible to reliably achieve the operational effects described above. In addition, for example, by setting the supply time of the $NH_3$ gas at step A longer than the supply time of the $SiCl_4$ gas at step B, it is possible to more reliably achieve the operational effects described above.

From this fact, the supply time of the $NH_3$ gas at step A may be set longer than the supply time of the $SiCl_4$ gas at step B, and the supply time of the $SiCl_4$ gas at step B may be set longer than the supply time of the $NH_3$ gas at step C in some embodiments. By setting the supply time s of the various kinds of gases at steps A, B, and C to have such a balance, it is possible to allow the SiN film formed on the wafer 200 to become a film having very excellent in-plane film thickness uniformity.

After-Purge and Atmospheric Pressure Return

After the aforementioned film-forming process is completed, the $N_2$ gas is supplied from the respective gas supply pipes 232c and 232d into the process chamber 201 and is exhausted from the exhaust pipe 231. Thus, the interior of the process chamber 201 is purged and the gas or the reaction byproduct, which remains within the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

Boat Unloading and Wafer Discharging

Thereafter, the seal cap 219 is moved down by the boat elevator 115 to open the lower end of the reaction tube 203. Then, the processed wafers 200 supported on the boat 217 are unloaded from the lower end of the reaction tube 203 to the outside of the reaction tube 203 (boat unloading). The processed wafers 200 are discharged from the boat 217 (wafer discharging).

(3) Effects According to the Present Embodiment

According to the present embodiment, one or more effects as set forth below may be achieved.

(a) By performing a cycle a predetermined number of times under the condition where $SiCl_4$ is not gas-phase decomposed after performing step A, the cycle including non-simultaneously performing step B and step C, it is possible to allow the SiN film formed on the wafer 200 to become a film having excellent in-plane film thickness uniformity.

This is because, by performing step B under the aforementioned conditions, i.e., under the conditions in which only the adsorptive substitution reaction occurs between the NH termination formed on the surface of the wafer 200 and $SiCl_4$, it is possible to allow the first SiN layer formed on the wafer 200 to become a layer whose entire surface is terminated with SiCl. That is, it is possible to allow the first SiN layer to become a layer to which self-limitation is applied for further Si adsorption reaction, i.e., for further adsorptive substitution reaction. As a result, it is possible to allow the first SiN layer formed on the wafer 200 to become a layer having excellent in-plane thickness uniformity. This also makes it possible to allow the second SiN layer formed by modifying the first SiN layer to become a layer having excellent in-plane thickness uniformity at subsequent step C.

Furthermore, by performing step C under the aforementioned conditions, i.e., under the conditions in which only the adsorptive substitution reaction occurs between the SiCl termination formed on the surface of the first SiN layer and $NH_3$, it is possible to allow the second SiN layer formed on the wafer 200 to become a layer whose entire surface is terminated with NH. This makes it possible for the adsorptive substitution reaction between the NH termination formed on the surface of the second SiN layer and $SiCl_4$ to go ahead uniformly over the entire surface of the wafer 200 at step B performed in the subsequent cycle. As a result, it is possible to allow the first SiN layer formed on the second SiN layer to become a layer having excellent in-plane thickness uniformity. This makes it possible to allow the second SiN layer formed by modifying the first SiN layer to become a layer having excellent in-plane thickness uniformity at subsequent step C.

As described above, according to the present embodiment, only the NH termination formed on the wafer 200 and the SiCl termination formed on the wafer 200 can be allowed to utilize a film-forming mechanism which contributes to the formation of the SiN film on the wafer 200. As a result, it is possible to allow the SiN film formed on the wafer 200 to become a film having excellent in-plane film thickness uniformity.

(b) By setting the supply time of the $SiCl_4$ gas at step B longer than the supply time of the $NH_3$ gas at step C, it is possible to allow the first SiN layer having SiCl termination formed on its surface formed on the wafer 200 to become a layer having excellent in-plane thickness uniformity. As a result, it is possible to allow the SiN film formed on the wafer 200 to become a film having excellent in-plane film thickness uniformity.

(c) By setting the supply time of the $NH_3$ gas at step A longer than the supply time of the $NH_3$ gas at step C, it is possible to uniformly form the NH termination from the outer peripheral portion to the central portion of the wafer 200. This makes it possible to allow the first SiN layer formed on the wafer 200 to become a layer having excellent in-plane thickness uniformity at step B performed in the subsequent cycle. As a result, it is possible to allow the SiN film formed on the wafer 200 to become a film having excellent in-plane film thickness uniformity.

In addition, by setting the supply time of the $NH_3$ gas at step A longer than the supply time of the $SiCl_4$ gas at step B, it is possible to more reliably achieve the aforementioned effects.

(d) Since the $SiCl_4$ gas is used as the precursor, although step B is performed under a relatively high temperature condition (temperature condition of 700 degrees C. or higher) in which the DCS gas or HCDS gas is gas-phase decomposed, it is possible to allow the thickness of the first SiN layer to become a uniform thickness of less than one atomic layer (less than one molecular layer) over the entire region in the plane of the wafer. Therefore, it is possible to precisely and stably control the thickness of the SiN film. That is, it is possible to allow the formation of the SiN film on the wafer 200 to go ahead with enhanced controllability.

Furthermore, when the DCS gas or HCDS gas is used as the precursor, for example, under a relatively high temperature condition of 700 degrees C. or higher, the precursor is vapor-phase decomposed and the Si-containing layer formed on the wafer 200 by supplying the precursor becomes a layer to which self-limitation is not applied for further Si adsorption reaction. Therefore, it is difficult to allow the thickness of the Si-containing layer formed by supplying these precursors to become a uniform thickness of less than one atomic layer (less than one molecular layer) over the entire region in the plane of the wafer under a relatively high temperature condition. As a result, it is difficult to precisely and stably control the thickness of the finally obtained SiN film.

(e) The effects mentioned above can be similarly achieved in the case where the aforementioned hydrogen nitride-based gas other than the $NH_3$ gas is used or in the case where the aforementioned inert gas other than the $N_2$ gas is used, as the first and second reactants. In addition, the effects mentioned above can be similarly achieved in the case where different hydrogen nitride-based gases are used as the first and second reactants.

Other Embodiments

While one embodiment of the present disclosure has been specifically described above, the present disclosure is not limited to the aforementioned embodiment but may be variously modified without departing from the spirit of the present disclosure.

At least one of step A and step C, the $NH_3$ gas activated by plasma may be supplied to the wafer 200. Even in this case, the same effects as those of the film-forming sequence illustrated in FIG. 4 may be achieved.

Recipes used in substrate processing may be prepared individually according to the processing contents and may be stored in the memory device 121c via a telecommunication line or an external memory device 123. Moreover, at the start of substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

In the case of using these substrate processing apparatuses, a film-forming process may be performed by the processing procedures and processing conditions similar to those of the embodiments and modifications described above. Effects similar to those of the embodiments and modifications described above may be achieved.

The embodiments, modifications and the like described above may be appropriately combined with one another. The processing procedures and processing conditions at this time may be similar to, for example, the processing procedures and processing conditions of the aforementioned embodiment.

EXAMPLES

First Example

In example 1, a film-forming process of forming a SiN film on a wafer was performed a plurality of times using the substrate processing apparatus illustrated in FIG. 1 and by the film-forming sequence illustrated in FIG. 4. The film-forming temperature was set at 650 degrees C., 700 degrees C., 750 degrees C., and 800 degrees C. Other processing conditions were set to predetermined conditions which fall within the processing condition range of the aforementioned embodiments.

In comparative example 1, after performing step A of the film-forming sequence illustrated in FIG. 4 to form NH termination on the wafer using the substrate processing apparatus illustrated in FIG. 1, a cycle is performed a predetermined number of times, the cycle including non-simultaneously performing a step B' of supplying a DCS gas to a wafer and a step C' of supplying an NH₃ gas to the wafer, whereby a film-forming process of forming a SiN film on the wafer was performed multiple times. The film-forming temperature was set at 550 degrees C., 600 degrees C., 650 degrees C., and 700 degrees C. The processing conditions at steps A, B' and C' were set similar to the processing conditions of steps A to C of the example, respectively.

Then, the in-plane film thickness uniformities of the SiN film formed in example 1 and comparative example 1 were each measured. The measurement results are shown in FIG. 6A.

Figure 6A:
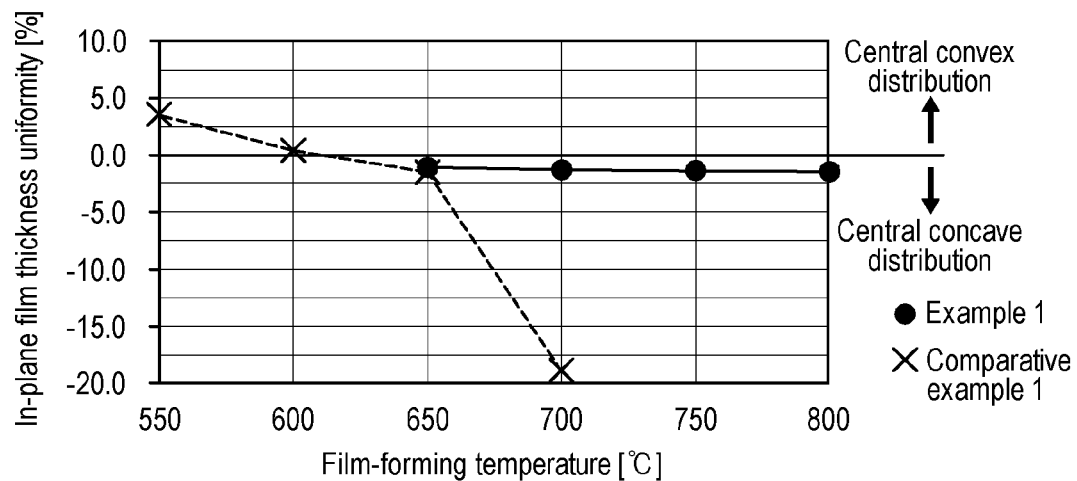
FIG. 6A is a diagram illustrating an evaluation result of film thickness uniformity of a SiN film formed on a substrate in a plane of the substrate.

The vertical axis in FIG. 6A indicates an in-plane film thickness uniformity (%) of the SiN film. When the value of the in-plane film thickness uniformity (%) is 0, it means that the film thickness of the SiN film is uniform from the central portion to the outer peripheral portion of the wafer. When the value of the in-plane film thickness uniformity (%) is larger than 0, it means that the thickness of the SiN film has a distribution which is the largest in the central portion of the wafer surface and is gradually decreased toward the outer peripheral portion thereof, i.e., a central convex distribution. When the value of the in-plane film thickness uniformity (%) is smaller than 0, it means that the thickness of the SiN film has a distribution which is the largest in the outer peripheral portion of the wafer surface and is gradually decreased toward the central portion thereof, i.e., a central concave distribution. In addition, the value of the in-plane film thickness uniformity (%) indicates that the in-plane film thickness uniformity of the SiN film formed on the wafer is better as it approaches zero. The horizontal axis in FIG. 6A indicates a film-forming temperature (degrees C.) when forming the SiN film. In FIG. 6A, the symbol ● indicates example 1 and the symbol x indicates comparative example 1.

According to FIG. 6A, it can be seen that the in-plane film thickness uniformity of the SiN film in example 1 is consistently excellent regardless of the film-forming temperature. In contrast, it can be seen that the in-plane film thickness uniformity of the SiN film in comparative example 1 varies greatly from the central convex distribution to the central concave distribution as the film-forming temperature increases. It is also understood that the in-plane film thickness uniformity of the SiN film in the comparative example shows a strong central concave distribution when the film-forming temperature exceeds 650 degrees C. That is, under a temperature condition of a high temperature exceeding at least 650 degrees C., it is understood that it is possible to more improve the in-plane film thickness uniformity of the SiN film by using the SiCl₄ gas as the precursor instead of using the DCS gas as the precursor.

In addition, a wet etching rate (hereinafter, referred to as a WER) of the SiN film formed in each of example 1 and comparative example 1 was measured, and each processing resistance was evaluated. The measurement results are shown in FIG. 6B.

Figure 6B:
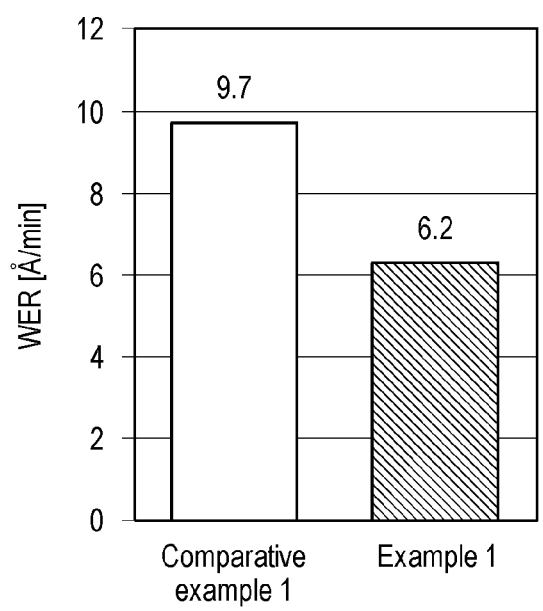
FIG. 6B is a diagram illustrating an evaluation result of processing resistance of a SiN film formed on the substrate.

The vertical axis in FIG. 6B indicates a WER (Å/min) of the SiN film with respect to hydrofluoric acid have a concentration of 1% (1% HF aqueous solution). The horizontal axis in FIG. 6B indicates comparative example 1 and example 1 in order. Comparative example 1 is a SiN film formed at a film-forming temperature of 650 degrees C., and example 1 is a SiN film formed at a film-forming temperature of 800 degrees C.

According to FIG. 6B, it can be seen that a WER (6.2 Å/min) of the SiN film of example 1 is smaller than a WER (9.7 Å/min) of the SiN film of comparative example 1. That is, it can be seen that the SiN film formed using the SiCl₄ gas as the precursor under a relatively high temperature condition has better processing resistance (wet etching resistance) than the SiN film formed using the DCS gas as the precursor under a relatively low temperature condition.

Example 2

In example 2, a SiN film was formed on a wafer using the substrate processing apparatus illustrated in FIG. 1 and by the film-forming sequence illustrated in FIG. 4. A bare wafer on which no pattern was formed and a pattern wafer on which a pattern is formed and which has a surface area 50 times the surface area of the bare wafer were used as the wafer. The processing condition at each step were set to predetermined conditions which fall within the processing condition range of the aforementioned embodiments.

In comparative example 2, after performing step A of the film-forming sequence illustrated in FIG. 4 to form NH termination on the wafer using the substrate processing apparatus illustrated in FIG. 1, a cycle is performed a predetermined number of times, the cycle including non-simultaneously performs a step B' of supplying a DCS gas to the wafer and a step C' of supplying an NH₃ gas to the wafer at, whereby a SiN film was formed on the wafer. The bare wafer and the pattern wafer described above were each used as the wafer. The processing conditions at steps A, B' and C' were set similar to the processing conditions at steps A to C of the example, respectively.

Then, the in-plane film thickness uniformities of the SiN film formed in example 2 and comparative example 2 were each measured. The measurement results are shown in FIG. 7. The vertical axis in FIG. 7 indicates an in-plane film thickness uniformity (%) of the SiN film, and meaning of its value is similar to the vertical axis in FIG. 6A. The horizontal axis in FIG. 7 indicates a case where the bare wafer is used as the wafer and a case where the pattern wafer is used as the wafer. In FIG. 7, a white columnar graph shows comparative example 2 and a shaded columnar graph shows example 2.

According to FIG. 7, it can be seen that the in-plane film thickness uniformity of the SiN film in example 2 is excellent both in the case where the bare wafer is used as the wafer and in the case where the pattern wafer is used as the wafer. In contrast, it can be seen that the in-plane film thickness uniformity of the SiN film in comparative example 2 shows a strong central convex distribution when the bare wafer is used as the wafer and a strong central concave distribution when the pattern wafer is used as the wafer. That is, it can be seen that the influence of the SiN film in example 2 on the in-plane film thickness uniformity due to the surface area of the wafer can be suppressed to be smaller than that on the SiN film in comparative example 2. In other words, it can be seen that the film-forming method in example 2 can suppress a so-called loading effect (substrate surface area dependency) to be smaller than that of the film-forming method in comparative example 2.

According to the present disclosure in some embodiments, it is possible to improve film thickness uniformity of a SiN film formed on the substrate in the plane of the substrate.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) forming NH termination on a surface of a substrate by supplying a first reactant containing N and H to the substrate;
   (b) forming a first Si- and N-containing layer having SiCl termination formed on its surface by supplying $SiCl_4$ as a precursor to the substrate to react the NH termination formed on the surface of the substrate with the $SiCl_4$;
   (c) forming a second Si- and N-containing layer having NH termination formed on its surface by supplying a second reactant containing N and H to the substrate to react the SiCl termination formed on the surface of the first Si- and N-containing layer with the second reactant; and
   (d) forming a Si- and N-containing film on the substrate by performing a cycle a predetermined number of times under a condition in which no gas-phase reaction occurs after performing (a), the cycle including non-simultaneously performing (b) and (c).

2. The method according to claim 1, wherein the cycle is performed the predetermined number of times under a condition where the $SiCl_4$ is not gas-phase decomposed.

3. The method according to claim 1, wherein the cycle is performed the predetermined number of times under a condition in which the $SiCl_4$ is not pyrolyzed.

4. The method according to claim 1, wherein the cycle is performed the predetermined number of times under a condition in which the $SiCl_4$ does not generate an intermediate.

5. The method according to claim 1, wherein (b) is performed under a condition in which an adsorptive substitution reaction occurs between the NH termination formed on the surface of the substrate and the $SiCl_4$, and
   wherein (c) is performed under a condition in which an adsorptive substitution reaction occurs between the SiCl termination formed on the surface of the first Si- and N-containing layer and the second reactant.

6. The method according to claim 1, wherein (b) is performed under a condition in which Si—N bonds are formed by bonding of Si constituting the $SiCl_4$ and N constituting the NH termination formed on the surface of the substrate, and at that time, Si—Cl bonds which are not converted into the Si—N bonds among Si—Cl bonds contained in the $SiCl_4$ are held without being broken.

7. The method according to claim 1, wherein (b) is performed under a condition in which at least a portion of Si—Cl bonds in the $SiCl_4$ and at least a portion of N—H bonds in the NH termination formed on the surface of the substrate are broken, and Si—N bonds are formed by bonding of Si after the at least a portion of Si—Cl bonds in the $SiCl_4$ are broken and N after the at least a portion of N—H bonds in the NH termination formed on the surface of the substrate are broken, and at that time, Si—Cl bonds which are not converted into the Si—N bonds among the Si—Cl bonds in the $SiCl_4$ are held without being broken.

8. The method according to claim 1, wherein (b) is performed under a condition in which Si constituting the $SiCl_4$ is bonded to N constituting the NH termination formed on the surface of the substrate in a state in which Cl is bonded to each of three bonds among four bonds of Si constituting the $SiCl_4$.

9. The method according to claim 1, wherein (b) is performed under a condition in which Si after at least a portion of Si—Cl bonds in the $SiCl_4$ are broken is bonded to N after at least a portion of N—H bonds in the NH termination formed on the surface of the substrate are broken in a state in which Cl is bonded to each of three bonds among four bonds of Si constituting the $SiCl_4$.

10. The method according to claim 1, wherein a supply time of the $SiCl_4$ in (b) is set longer than a supply time of the second reactant in (c).

11. The method according to claim 1, wherein a supply time of the first reactant in (a) is set longer than a supply time of the second reactant in (c).

12. The method according to claim 1, wherein a supply time of the first reactant in (a) is set longer than a supply time of the $SiCl_4$ in (b), and the supply time of the $SiCl_4$ in (b) is set longer than a supply time of the second reactant in (c).

13. The method according to claim 1, wherein a supply time of the $SiCl_4$ in (b) is set such that an amount of an adsorptive substitution reaction occurring between the NH termination formed on the surface of the substrate and the $SiCl_4$ in a central portion of the substrate becomes substantially equal to an amount of an adsorptive substitution reaction occurring between the NH termination formed on the surface of the substrate and the $SiCl_4$ in an outer peripheral portion of the substrate.

14. The method according to claim 1, wherein a supply time of the $SiCl_4$ in (b) is set such that a thickness of the first Si- and N-containing layer formed in a central portion of the substrate becomes substantially equal to a thickness of the first Si- and N-containing layer formed in an outer peripheral portion of the substrate.

15. The method according to claim 1, wherein in (a), the first reactant is supplied to the substrate from a side of the substrate, and
   wherein, in (b), the $SiCl_4$ is supplied to the substrate from the side of the substrate, and
   wherein, in (c), the second reactant is supplied to the substrate from the side of the substrate.

16. The method according to claim 1, wherein the first Si- and N-containing layer includes a silicon nitride layer, the second Si- and N-containing layer includes a silicon nitride layer, and the Si- and N-containing film includes a silicon nitride film.

17. The method according to claim 1, wherein the first reactant includes at least one selected from a group of $NH_3$, $N_2H_2$, $N_2H_4$, and $N_3H_8$, and the second reactant includes at least one selected from a group off $NH_3$, $N_2H_2$, $N_2H_4$, and $N_3H_8$.

18. The method according to claim 1, wherein a pattern is formed on the surface of the substrate, the pattern including a recess, and
   wherein the recess is a trench or a hole.

19. A substrate processing apparatus, comprising:
   a process chamber in which a substrate is processed;
   a reactant supply system configured to supply a first reactant containing N and H and a second reactant containing N and H to the substrate in the process chamber;
   a precursor supply system configured to supply $SiCl_4$ as a precursor to the substrate in the process chamber;
   a heater configured to heat the substrate in the process chamber; and a controller configured to control the reactant supply system, the precursor supply system, and the heater so as to perform a process in the process chamber, the process comprising:
   (a) forming NH termination on a surface of the substrate by supplying the first reactant to the substrate;
   (b) forming a first Si- and N-containing layer having SiCl termination formed on its surface by supplying the $SiCl_4$ to the substrate to react the NH termination formed on the surface of the substrate with the $SiCl_4$;
   (c) forming a second Si- and N-containing layer having NH termination formed on its surface by supplying the second reactant to the substrate to react the SiCl termination formed on the surface of the first Si- and N-containing layer with the second reactant; and
   (d) forming a Si- and N-containing film on the substrate by performing a cycle a predetermined number of times under a condition in which no gas-phase reaction occurs after performing (a), the cycle including non-simultaneously performing (b) and (c).

20. A non-transitory computer-readable recording medium storing a program that causes, by a computer, a substrate processing apparatus to perform a process in a process chamber of the substrate processing apparatus, the process comprising:
   (a) forming NH termination on a surface of a substrate by supplying a first reactant containing N and H to the substrate;
   (b) forming a first Si- and N-containing layer having SiCl termination formed on its surface by supplying $SiCl_4$ as a precursor to the substrate to react the NH termination formed on the surface of the substrate with the $SiCl_4$;
   (c) forming a second Si- and N-containing layer having NH termination formed on its surface by supplying a second reactant containing N and H to the substrate to react the SiCl termination formed on the surface of the first Si- and N-containing layer with the second reactant; and
   (d) forming a Si- and N-containing film on the substrate by performing a cycle a predetermined number of times under a condition in which no gas-phase reaction occurs after performing (a), the cycle including non-simultaneously performing (b) and (c).

* * * * *